United States Patent [19]
Gandini et al.

[11] Patent Number: 4,595,940
[45] Date of Patent: Jun. 17, 1986

[54] UNIT CELL FOR INTEGRATED-CIRCUIT GATE ARRAYS

[75] Inventors: Marco Gandini; Dante Trevisan, both of Turin, Italy

[73] Assignee: Cselt Centro Studi e Laboratori Telecomunicazioni S.p.A., Turin, Italy

[21] Appl. No.: 485,170

[22] Filed: Apr. 15, 1983

[30] Foreign Application Priority Data

Apr. 15, 1982 [IT] Italy ............................... 67501 A/82

[51] Int. Cl.⁴ ..................... H01L 27/08; H01L 29/78; H01L 27/10
[52] U.S. Cl. ....................................... 357/42; 357/41; 357/45; 357/59
[58] Field of Search ..................... 357/45, 42, 41, 23 S, 357/23.9, 59

[56] References Cited

U.S. PATENT DOCUMENTS

| | | | |
|---|---|---|---|
| 3,943,551 | 3/1976 | Skorup | 357/42 |
| 4,356,504 | 10/1982 | Tozun | 357/54 |
| 4,412,237 | 10/1983 | Matsumura et al. | 357/41 |

FOREIGN PATENT DOCUMENTS

57-49253 3/1982 Japan .

Primary Examiner—William D. Larkins
Attorney, Agent, or Firm—Karl F. Ross; Herbert Dubno

[57] ABSTRACT

A unit cell for a prefabricated semiconductor chip, to be converted into an array of logic gates by selective metallization, comprises two complementary pairs of MOSFETs occupying respective quadrants of a rectangular substrate area, with external gate contacts disposed in respective headers extending along the minor sides of the rectangle. Each header further contains two external channel (source or drain) contacts which with the two external gate contacts form a group of four input/output contacts. Two metallic strips serving as supply buses, parallel to the minor sides, are separated from the two headers by relatively narrow substrate zones so as to define a relatively wide central region between them. The external gate contacts of two diagonally opposite MOSFETs are interconnected by a strip of polycrystalline silicon crossing the supply buses, each of these buses being also crossed by a respective polysilicon strip linking the other external gate contact of the proximal contact group with an internal gate contact located in the central region. The two external channel contacts in each header, which are disposed near the corners of the cell area, are paired with respective internal contacts also located in the central region on correspondingly doped substrate portions, as are two other internal channel contacts each common to a respective transistor pair and located in an inner terminal section of its respective transistor pair which is separated from the associated outer terminal sections thereof by the polysilicon strips running between the associated external and internal gate contacts. A further polysilicon strip extends along one of the major sides of the cell area to facilitate certain intercell connections.

8 Claims, 49 Drawing Figures

UNIT CELL FOR INTEGRATED-CIRCUIT GATE ARRAYS

FIELD OF THE INVENTION

Our present invention relates to a semiconductor chip designed to form an integrated array of logic-gate circuits. More particularly, this invention concerns a prefabricated chip divided into a multiplicity of unit cells to be subsequently converted, by selective metallization, into gate circuits and other constituents of a logic network.

BACKGROUND OF THE INVENTION

In the manufacture of such chips, an important consideration is the optimum utilization of the available surface area to accommodate a maximum number of components without sacrificing operating efficiency and reliability. Thus, the cells are generally made of uniform rectangular outline disposed in parallel rows which are traversed by supply buses in the form of metallic strips insulated from the substrate by an intervening oxide layer. Each cell area is subdivided into suitably doped portions overlain by metal electrodes which, on final metallization, can be selectively connected to one another and/or to the associated supply buses.

A typical prior-art array of this character has been described in an article titled CAD PITS SEMICUSTOM CHIPS AGAINST STANDARD SLICES by Joseph H. Kroeger and Orhan N. Tozun, published 3 July 1980 in ELECTRONICS Magazine. According to this article, computer-aided design (CAD) algorithms are used to program the final metallization of the unit cells -- termed "master slices" -- of a gate array, the doping of each cell establishing therein the source, drain and channel sections of two cascades of three MOS field-effect transistors (MOSFETs) each. Within each cascade, two adjoining MOSFETS share a common source or drain section with two terminals each, disposed on opposite sides of an associated supply bus. Each cascade, therefore, consists of four such terminal (source or drain) sections separated by three channel sections of the opposite conductivity type, these channel sections being overlain by strips of polycrystalline silicon -- referred to hereinafter as polysilicon--each extending across the two supply buses and terminating at a pair of gate contacts that are associated with one transistor from each cascade and lie at opposite minor sides of the rectangular cell area. Each cell further includes an additional polysilicon strip, spaced from the MOSFET regions, that extends along a major side of the cell areas from one corner to the other and carries a pair of contacts which, however, appear unutilized in the array actually illustrated. In that array, moreover, the several rows of unit cells or master slices traversed by respective pairs of supply buses are separated from one another by relatively wide transverse zones containing further contact strips designed to enable the conductive interconnection of selected cells of one or both adjoining rows.

OBJECTS OF THE INVENTION

The general object of our present invention is to provide an improved chip structure for an integrated-circuit array of the kind referred to which is considerably more compact than the known arrangement while essentially satisfying the same desiderata or dependability and versatility.

A more particular object is to provide a unit-cell structure for such an array which affords more convenient access to source and drain electrodes of its MOSFETs.

A further object is to provide an array of this kind whose cells can be converted into dynamic memories with capacitive signal storage.

SUMMARY OF THE INVENTION

We have found, in accordance with our present invention, that the aforestated objects can be realized with unit cells whose rectangular area is divided into four quadrants each accommodating a respective MOSFET, two of them being of the n-channel type and the other two being of the p-channel type. Thus, each cell includes two major doped portions of opposite conductivity types respectively extending across the supply buses in insulated relationship therewith, each of these major doped portions being the side of a respective pair of cascaded MOSFETs. With the area further divided by the two buses into two marginal regions adjacent its minor sides and a central region between the buses, each MOSFET bridges the central region and one of the marginal regions. Within a major doped area traversed by a bus, two minor doped portions of the opposite conductivity type extend across that bus and define the channel sections of the corresponding MOSFET pair lying between two outer terminal (source or drain) sections and an inner terminal (drain or source) section, the latter being common to the two MOSFETs of the pair. This inner terminal section is overlain by a common channel centact disposed in the central region. The outer terminal sections of each MOSFET pair are respectively overlain by accessible external channel contacts disposed in and accessible from the exterior of the marginal region thereof and, preferably, also by internal channel contacts disposed in the central region. In addition, each MOSFET is provided with an exteriorly accessible external gate contact disposed in the corresponding marginal region, the external gate contacts of two diagonally opposite and mutually complementary MOSFETs of the two pairs being interconnected by a polysilicon strip overlying the associated channel sections while insulating intersecting both buses.

According to another feature of our invention, the external gate contacts of the two remaining mutually complementary MOSFETs are connected by further polysilicon strips, each insulatedly intersecting one of the buses, to respective companion internal gates contacts that are disposed in the central region.

Advantageously, pursuant to a further feature of our invention, the external channel and gate contacts of each MOSFET pair are aligned adjacent a respective minor side of the cell area in what may be called a header, thus constituting exteriorly readily accessible input/output contacts. Aside from the two common channel contacts, all other contacts of the two MOSFET pairs are preferably concentrated in a midportion of the central region that is separated from the two common channel electrodes by two throughgoing transverse zones which, like two similar throughgoing zones lying between each header and the bus proximal thereto, provide space for the deposition of further conductor strips during subsequent metallization. For maximum compactness consistent with the need to accommodate such conductor strips within the cell area, and on the assumption that the width of these conductor strips is approximately equal to that of the supply buses, we prefer to give each of these zones a width lying between one and two times the bus width.

BRIEF DESCRIPTION OF DRAWING

The above and other features of our invention will now be described in detail with reference to the accompanying drawing in which.

SPECIFIC DESCRIPTION

Figure 1:
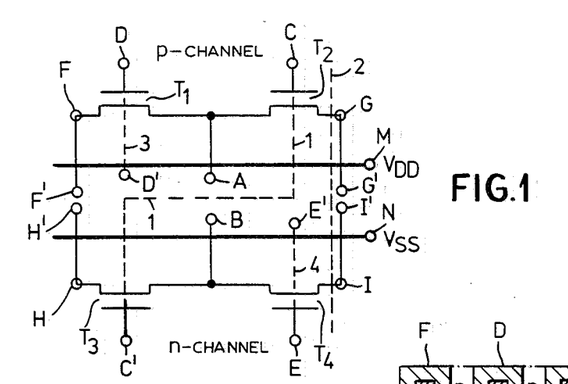
FIG. 1 is a circuit diagram schematically indicating the locations of four MOSFETs and their contacts relatively to a pair of supply buses in a unit cell of a semiconductor chip embodying our invention.

In FIG. 1 we have schematically illustrated the essential constituents of a unit cell of a silicon chip embodying our invention, including two cascaded p-channel MOSFETs $T_1$, $T_2$ and two cascaded n-channel MOSFETs $T_3$, $T_4$ disposed in respective quadrants of a rectangular cell area. Two supply buses $V_{DD}$ and $V_{SS}$, one of which may be grounded, extend across the area between the two MOSFET pairs $T_1$, $T_2$ and $T_3$, $T_4$. A channel contact A, located in a central region between the two buses, is common to an inner terminal section (e.g. drain) of the two MOSFETs $T_1$, $T_2$ of the p-channel pair; a similar channel contact B, also lying in that central region, analogously serves a common terminal section of the two MOSFETs $T_3$, $T_4$ of the n-channel pair. Outer terminal sections (sources) of MOSFETs $T_1$ and $T_2$ are provided with respective exteriorly accessible external channel contacts F and G disposed in a marginal region of the cell area between one of its minor sides and bus $V_{DD}$ as more particularly illustrated in FIG. 2 discussed hereinafter. Similarly, exteriorly accessible external channel contacts H and I serve respective outer terminal sections of MOSFETs $T_3$, $T_4$ and lie in another marginal region between the opposite minor side and the bus $V_{SS}$. MOSFETs $T_1$–$T_4$ are further provided with exteriorly accessible external gate contacts respectively designated D, C, C' and E. Supply terminals M and N, lying outside the cell area, are respectively connected to buses $V_{DD}$ and $V_{SS}$.

Thin solid lines in FIG. 1, distinct from the heavy lines denoting the two buses, indicate conductive connections via doped substrate portions. Such connections link external channel contacts F, G, H, I with respective internal channel contacts F', G', H', I' located in the central substrate region. In contradistinction thereto, dotted lines 1, 2, 3 and 4 in FIG. 1 represent polysilicon strips extending above the substrate across buses $V_{DD}$ and $V_{SS}$ from which they are separated by nonillustrated oxide layers. More particularly, strip 1 interconnects external gate contacts C and C', strips 3 and 4 respectively connect external gate contacts D and E to associated companion internal gate contacts D' and E' in the central region, and strip 2 overlies the central and marginal regions without being connected to any contact.

Figure 2:
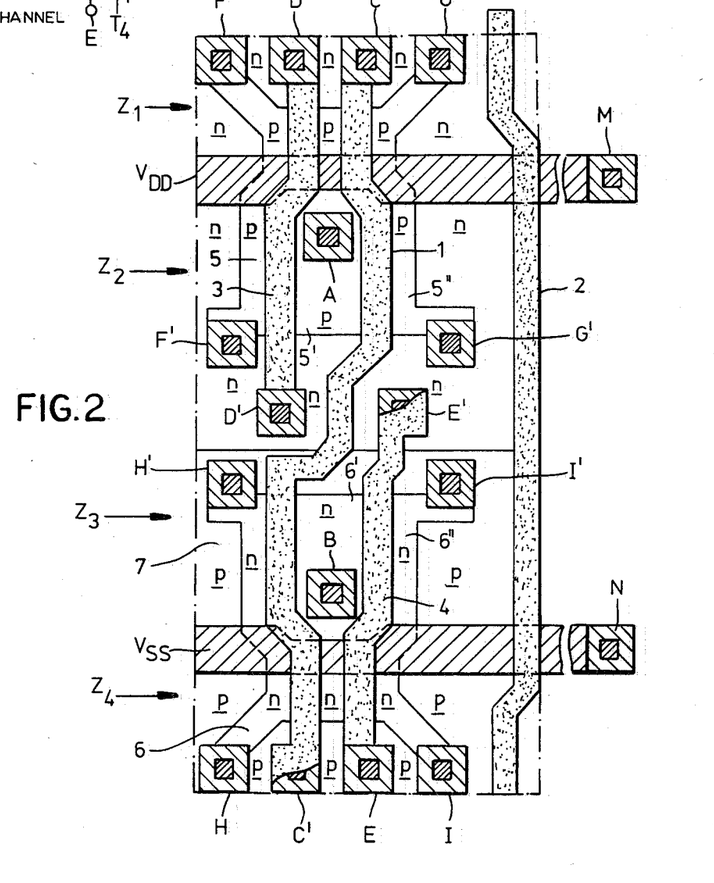
FIG. 2 is a diagram drawn to a large scale to show the physical layout of such a unit cell.
Figure 3:
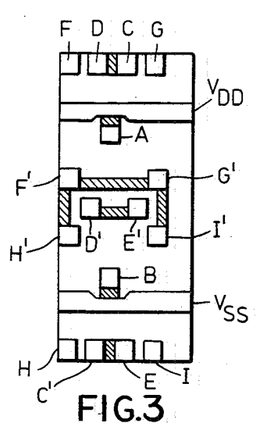
FIGS. 3–49 are face views of cells or cell groupings according to our invention, illustrating respective instances of selective metallization to provide a variety of different circuit components.
Figure 4:
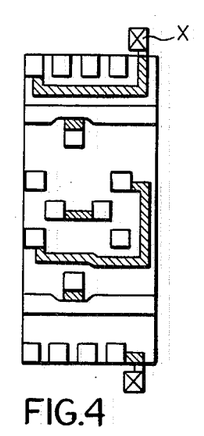
Figure 5:
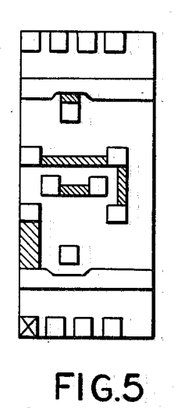

As particularly illustrated in FIG. 2, the four input/output contacts represented by external contacts C, D, F and G associated with the p-channel MOSFET pair are aligned along an upper minor side of the rectangular cell area while corresponding contacts C', E, H and I associated with the n-channel MOSFETs are similarly aligned along the lower minor side of that area. These two groups of contacts, according, form a pair of headers which are readily accessible from the exterior of the unit cell for connection to other cells of the array or, possibly, to outside circuitry.

In the two upper quadrants of the cell area, which contain the MOSFETs $T_1$ and $T_2$, the silicon substrate of n-type conductivity incorporates a major p-doped portion divided by oppositely doped minor portions into two outer terminal sections 5, 5" and an inner terminal section 5' respectively constituting the two sources and the common drain of MOSFETs $T_1$ and $T_2$ (FIG. 1). The said oppositely doped intervening minor portions form channel sections respectively overlain by polysilicon strips 3 at left and 1 at right. Within the central region, the common channel contact A of this MOSFET pair overlies inner section 5' between strips 1 and 3 in the vicinity of bus $V_{DD}$ which, as shown, is somewhat reduced in width at that location.

In the two lower quadrants of the rectangular cell area shown in FIG. 2, the substrate is doped to form a p-well 7 (cf., for example, U.S. Pat. No. 4,277,291) surrounding a major n-doped portion which is split by two intervening minor p-doped channel sections into two outer terminal sections 6, 6" and an inner terminal section 6'. Polysilicon strip 1 overlies the left-hand channel section, separating terminal sections 6 and 6' from each other, while the right-hand channel section between terminal sections 6' and 6" is overlain by strip 4. Common channel contact B, overlying section 6' between strips 1 and 4, is located within the central region close to bus $V_{SS}$ which is also somewhat reduced in width at that point. Thus, the two mutually complementary MOSFET pairs are virtually symmetrical, with polysilicon strip 1 interlinking the gate contacts C and C' of the diagonally opposite MOSFETs $T_2$ and $T_3$.

The several polysilicon strips 1–4 have been indicated in FIG. 2 by stippling. Metallic parts, such as buses $V_{DD}$, $V_{SS}$ and the several contacts, have been denoted by hatching; such hatching is also being used in FIGS. 3–49 to show conductor strips deposited by final metallization.

Not illustrated are the various oxide layers interposed between the substrate, the overlying silicon strips and the exposed metallic parts thereabove. Strip 2 is shown to extend beyond the actual cell area, along its major right-hand edge, outside the adjacent p-doped and n-doped terminal sections 5" and 6", respectively; gate contacts C, D and C', E also lie outside the major doped portions of the associated MOSFETs.

FIG. 2 further shows that the header containing contacts C, D, F, G is separated from bus $V_{DD}$ by a throughgoing transverse zone $Z_1$ whose width is somewhat greater than that of bus $V_{DD}$ but less than twice the latter width. A similar throughgoing zone $Z_2$ lies between common channel contact A and a midportion of the central cell region containing internal contacts D'–I'. Two further such zones $Z_3$ and $Z_4$ separate the last-mentioned contact assembly from common channel contact B and the bus $V_{SS}$ from the header containing contacts C', E, H, I. These four zones, as will be apparent from FIGS. 3–49, will accommodate requisite intracell and intercell connections in most instances, with only a few external conductors required in certain cases. Some contacts, disposed outside a cell area, may be connected to an internal conductor strip as shown at X in FIG. 4 or may be left unconnected as shown at Y in FIG. 29, for example. While the polysilicon strips have not been indicated in FIGS. 3–49, a strip 2 may be joined to an internal conductor as shown for example at W in FIG. 48.

Figure 32:
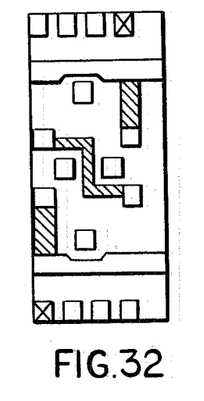
Figure 33:
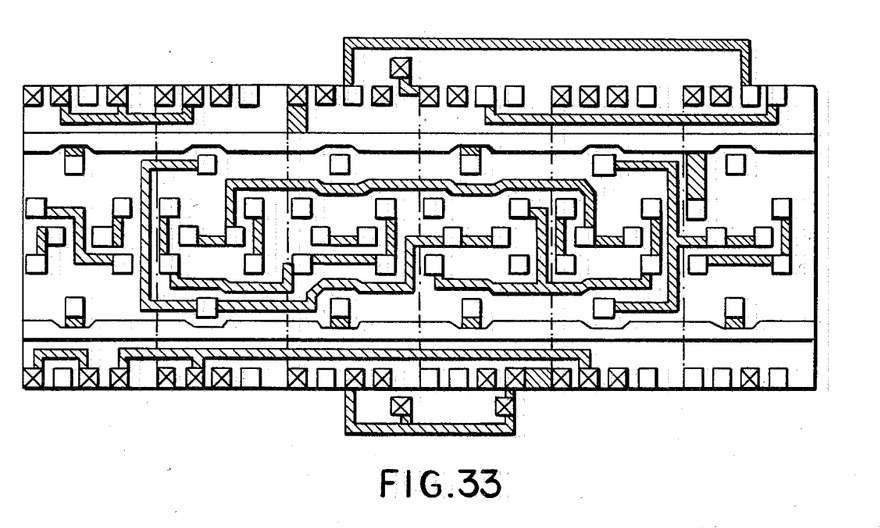
Figure 34:
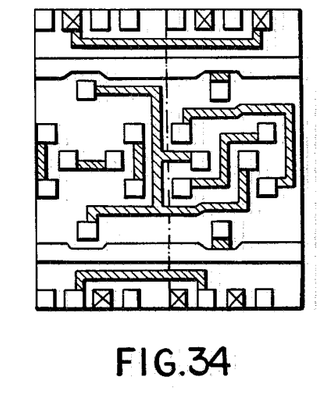
Figure 35:
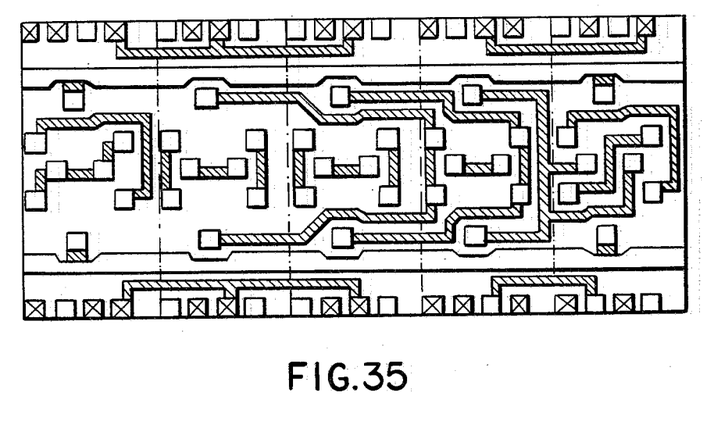
Figure 36:
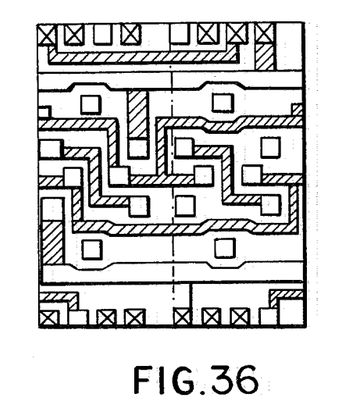
Figure 37:
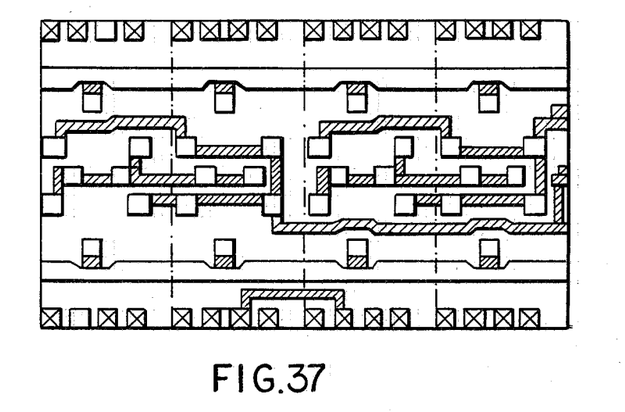
Figure 38:
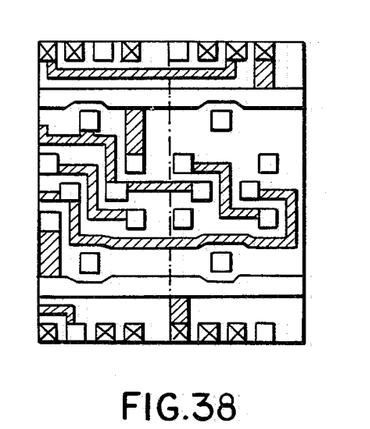
Figure 39:
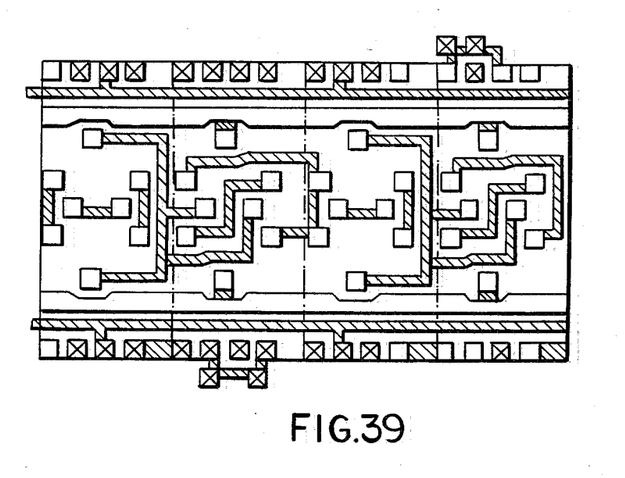
Figure 40:
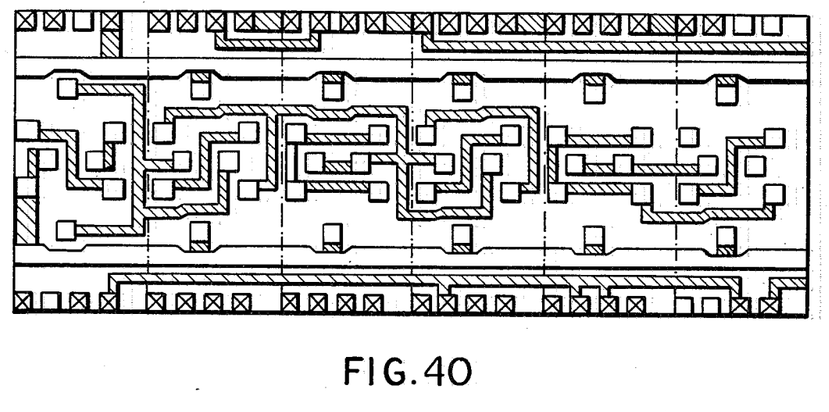
Figure 41:
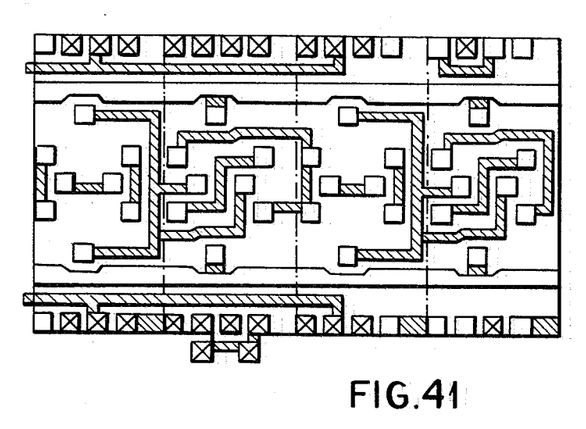
Figure 42:
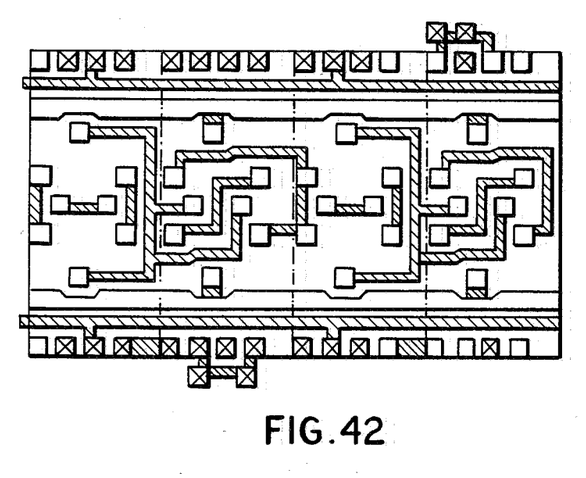
Figure 43:
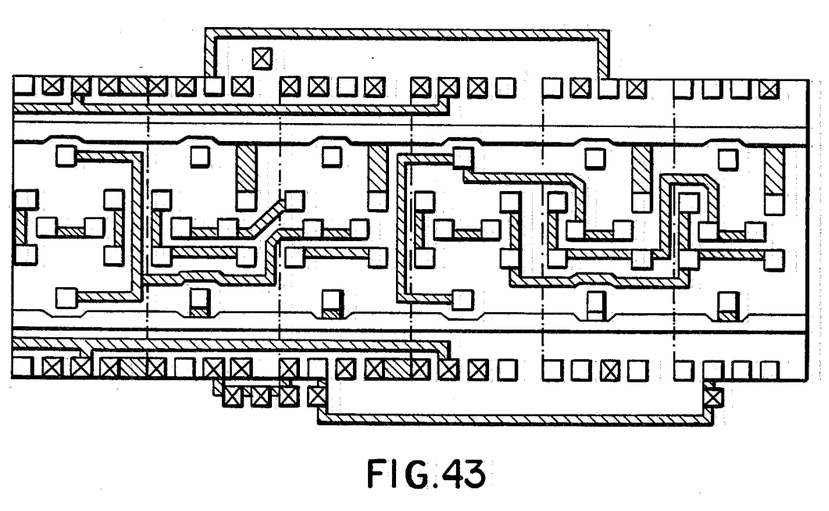

More particularly, individual unit cells according to our invention may form a fast inverter (FIG. 3), a double inverter (FIG. 4), a 2-input NAND gate (FIG. 5), a 2-input NR gate (FIG. 12), or a tri-state output port (FIG. 32).

Figure 47:
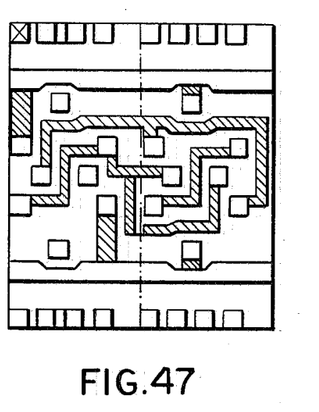
Figure 48:
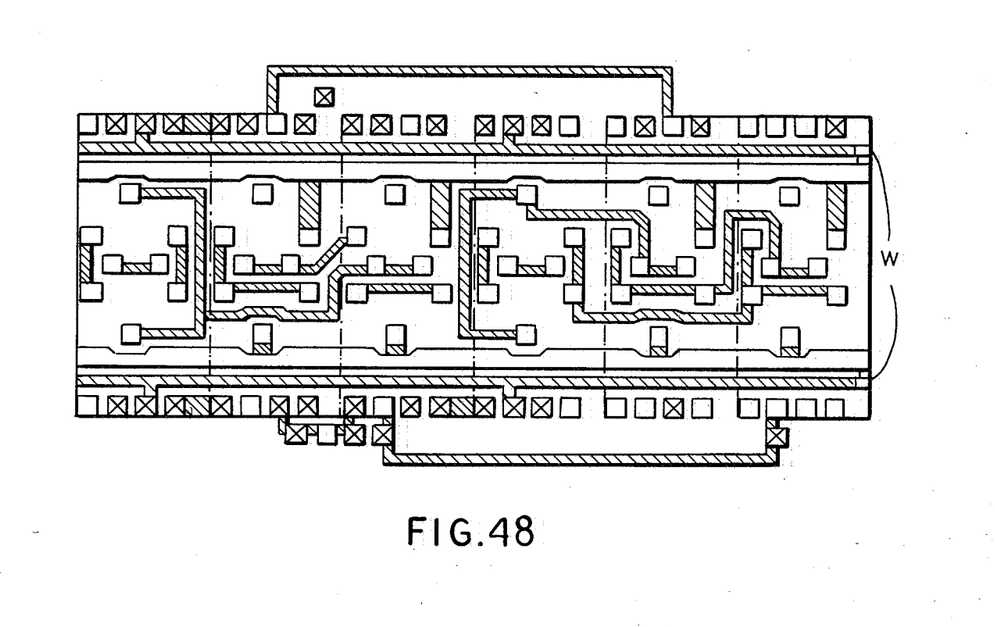
Figure 49:
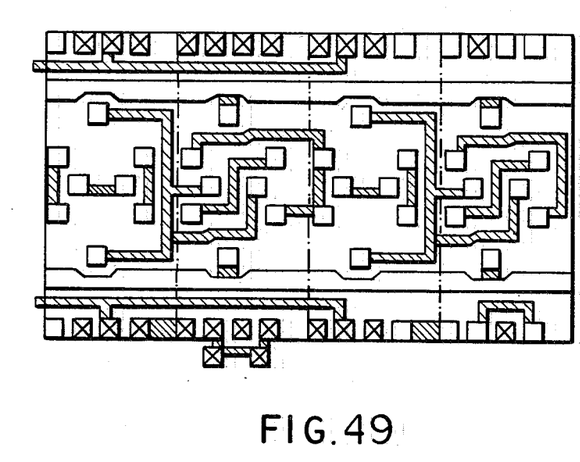

A 2-cell group may form a 2-input NAND plus AND gate with inverter (FIG. 7), a 3-input NAND gate with inverter (FIG. 8), a 3-input NAND plus AND gate (FIG. 9), a 4-input NAND gate (FIG. 10), a 2-input NOR/OR gate with inverter (FIG. 13), a 3-input NOR gate with inverter (FIG. 14), a 3-input NOR plus OR gate (FIG. 15), a 4-input NOR gate (FIG. 16), a double AND gate plus NOR gate (FIG. 20), a 2-input multiplexer (FIG. 34), a set/reset flip-flop composed of NAND gates (FIG. 26) or OR gates (FIG. 27), an intermediate stage (FIG. 36) or terminal stage (FIG. 38) of a dynamic shift register, an intermediate stage (FIG. 45) or terminal stage (FIG. 46) of a latch register, or an input trigger or threshold compartor (FIG. 47).

Figure 25:
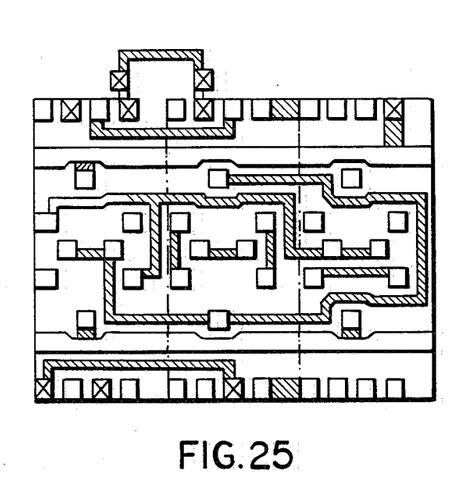
Figure 26:
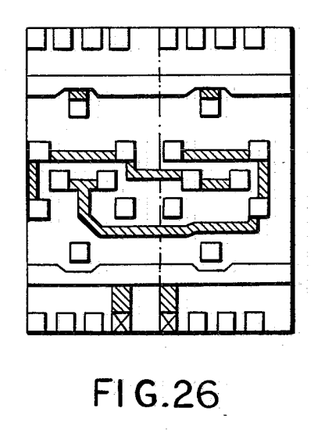
Figure 27:
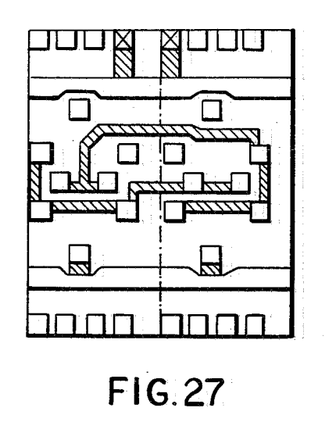
Figure 28:
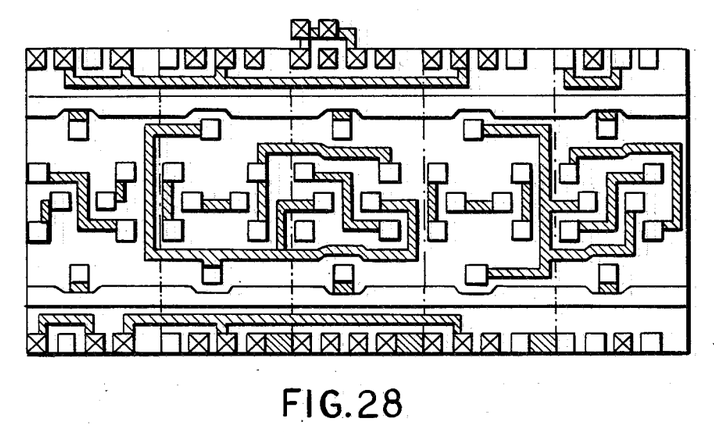

A 3-cell group may constitute a 4-input NAND plus AND gate with inverter (FIG. 11), a 4-input NOR plus OR gate with inverter (FIG. 17), an Exclusive-OR gate plus NOR gate (FIG. 18), a double AND/NOR gate plus OR gate with inverter (FIG. 21), a D-type storage unit or latch (FIG. 31), a similar unit with setting input (FIG. 19), or the same with resetting input (FIG. 25).

Figure 44:
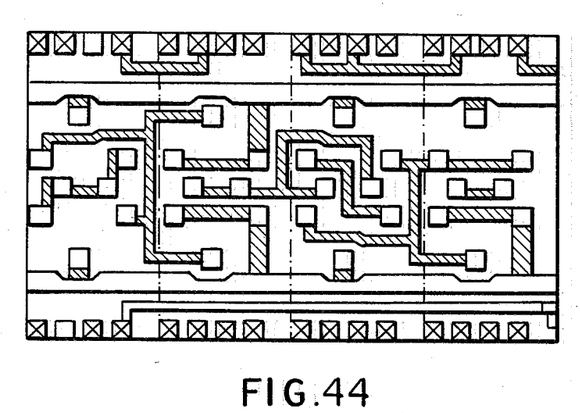
Figure 45:
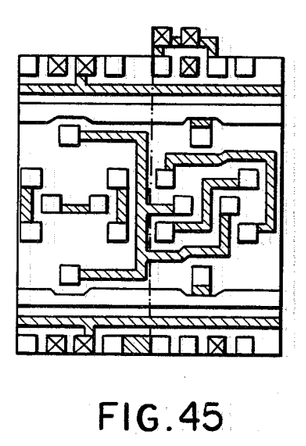
Figure 46:
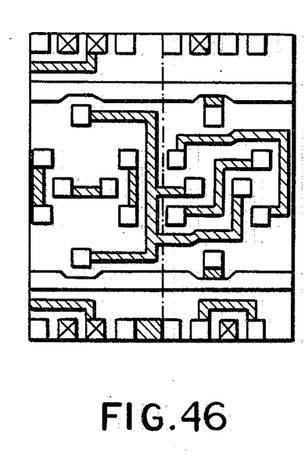

A 4-cell group may be converted into a two-bit half-adder with inverter (FIG. 23), a D-type set/reset latch (FIG. 30), a dynamic register with clock driver (FIG. 37), an intermediate stage (FIG. 39) or terminal stage (FIG. 41) of a shift register, an intermediate stage (FIG. 42) or terminal stage (FIG. 49) of a D-type register, or a clock driver (FIG. 44).

Figure 6:
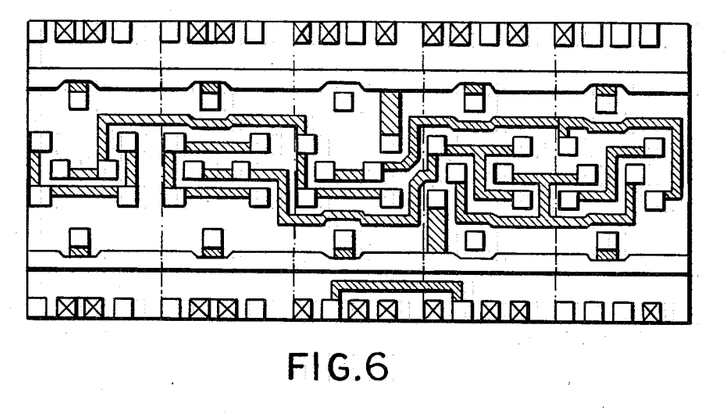
Figure 7:
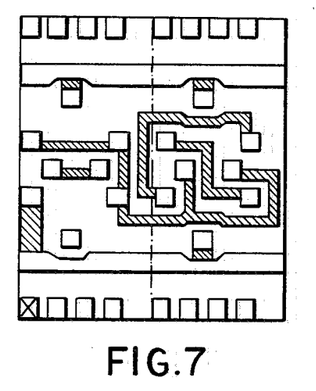
Figure 8:
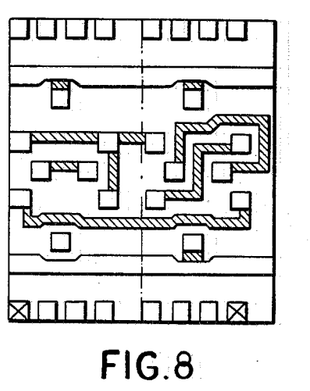
Figure 9:
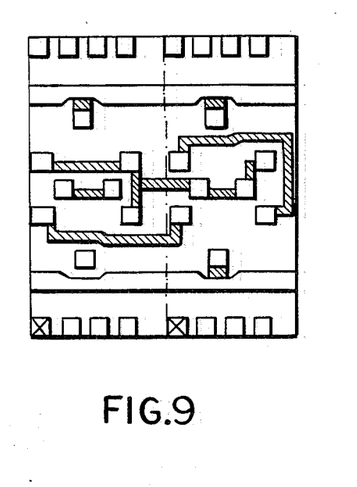
Figure 10:
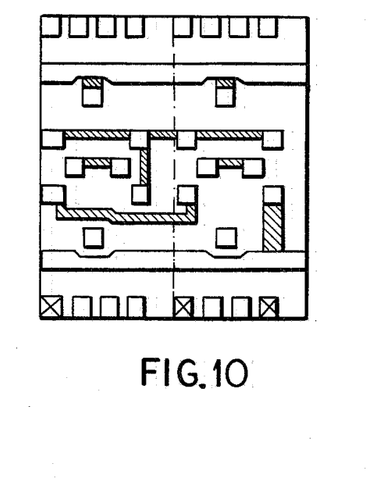
Figure 11:
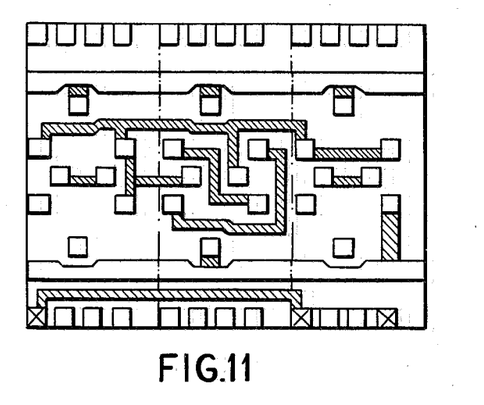
Figure 12:
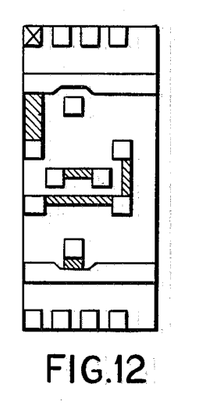
Figure 13:
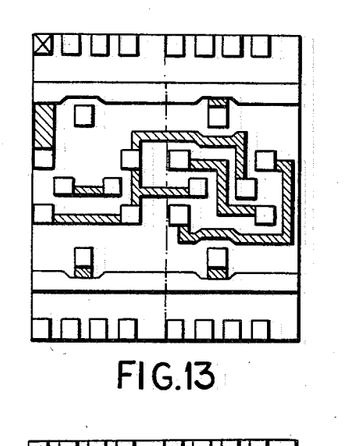
Figure 14:
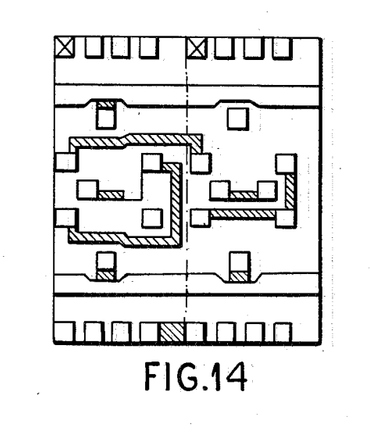
Figure 15:
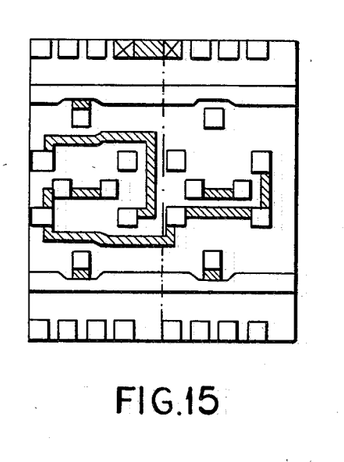
Figure 16:
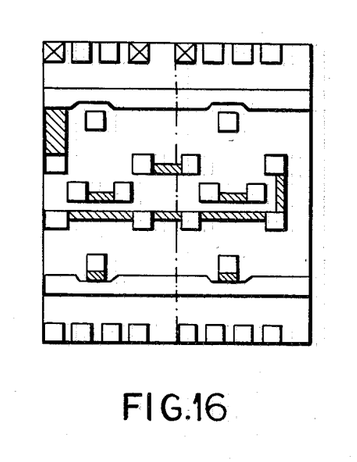
Figure 17:
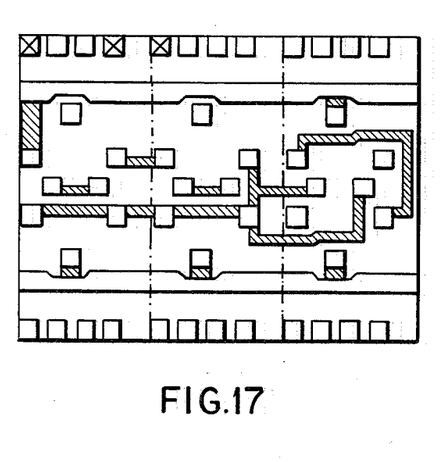
Figure 18:
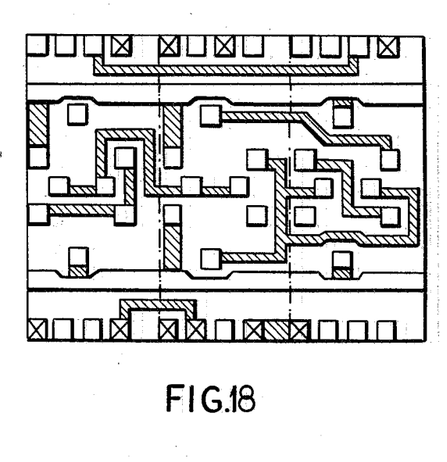
Figure 19:
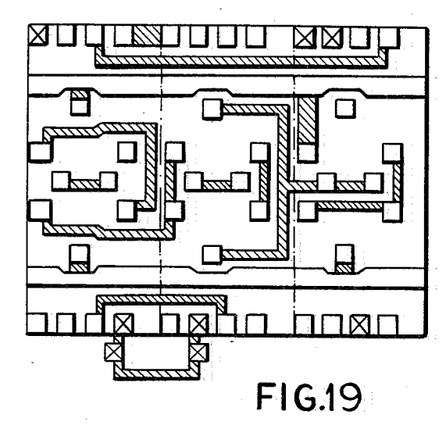
Figure 20:
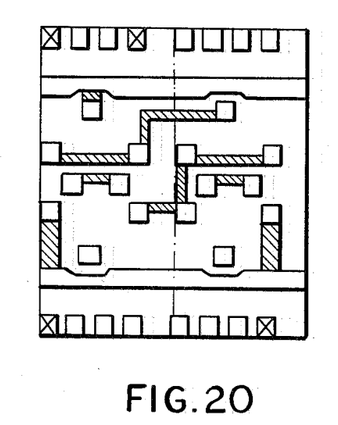
Figure 21:
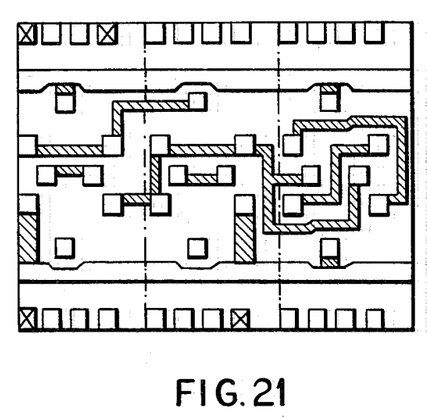
Figure 22:
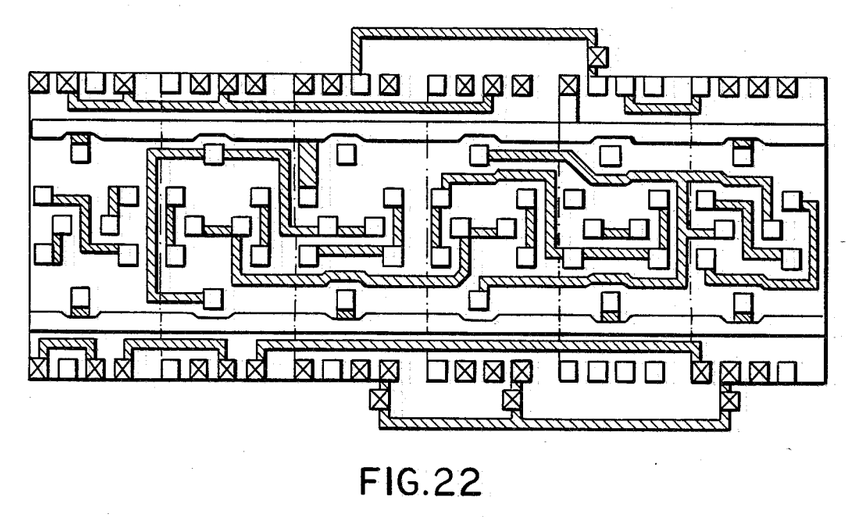
Figure 23:
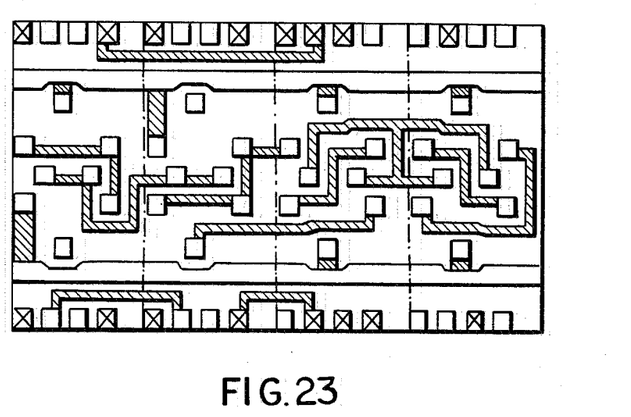
Figure 24:
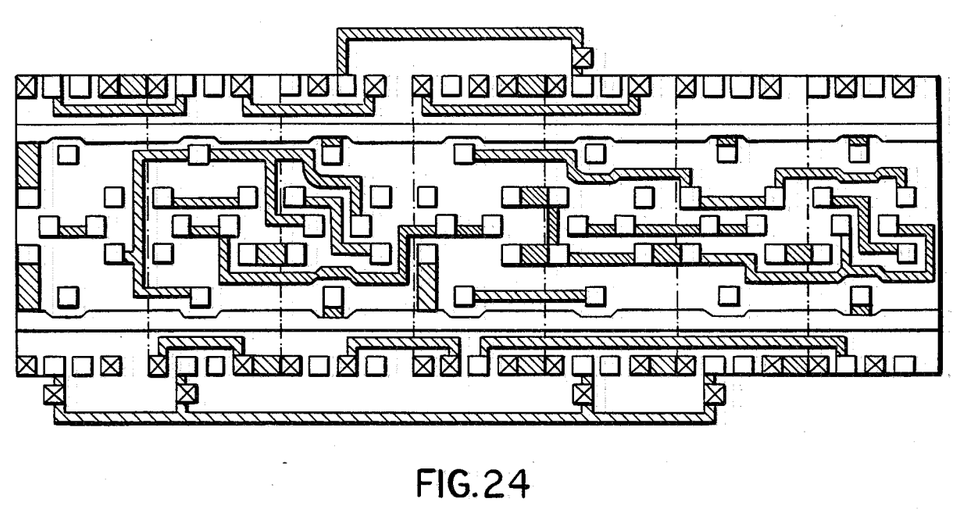

A 5-cell group may be designed as a 4-input multiplexer (FIG. 35), a D-type flip-flop (FIG. 28), or a driver with tri-state output port (FIG. 6).

A 6-cell group can form a D-type flip-flop with setting input (FIG. 22) or resetting input (FIG. 33), a clock driver (FIG. 40), or an intermediate stage (FIG. 48) or terminal stage (FIG. 43) of a settable and resettable D-type register.

Figure 29:
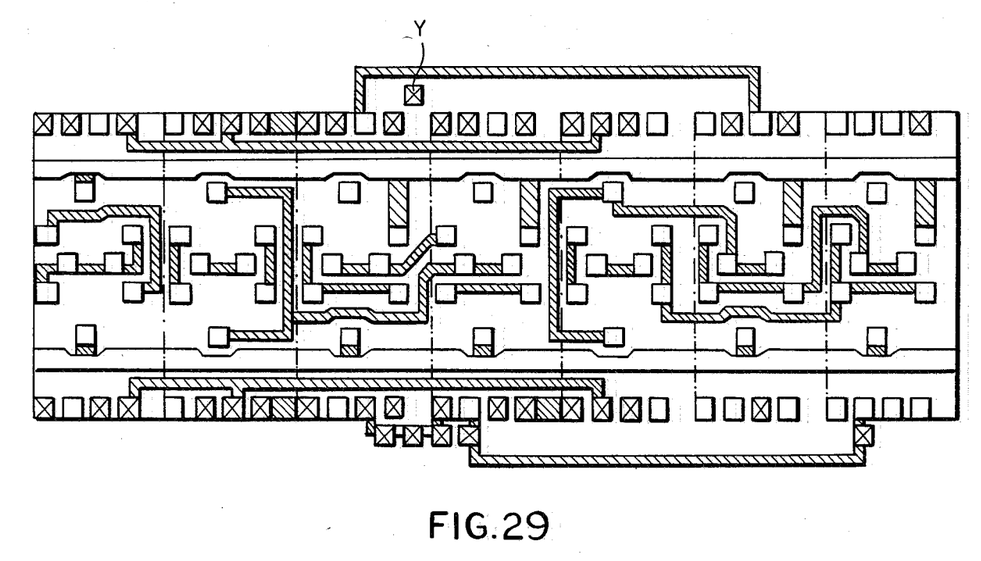
Figure 30:
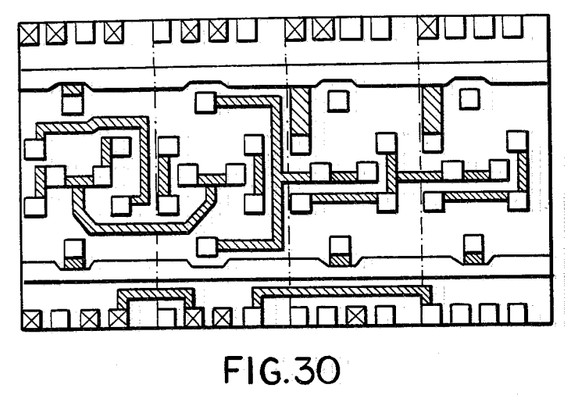
Figure 31:
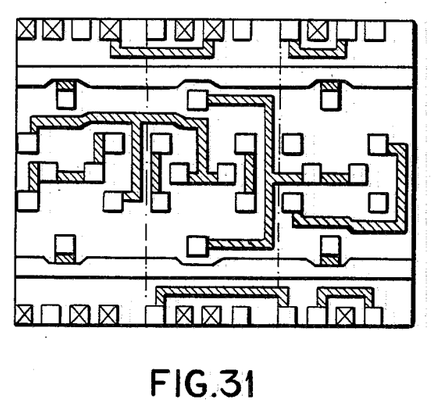

A 7-cell group may operate as a full three-bit adder (FIG. 24) or as a D-type set/reset flip-flop (FIG. 29).

In FIGS. 3–49 certain input/output contacts, marked by crosses, are not used for external connections.

We claim:

1. A semiconductor chip comprising:
   a substrate divided into a multiplicity of unit cells of rectangular outline convertible into logic gates by selective metallization, said substrate being provided with two supply buses in the form of metallic strips extending across a row of such unit cells parallel to the minor sides of the rectangular areas thereof, said buses dividing each of said areas into two marginal regions adjacent said minor sides and a central region between said buses,
   each of said unit cells including two major doped portions of opposite conductivity types respectively extending across said buses in insulated relationship therewith,
   each of said major doped portions being the side of a respective pair of cascaded MOS field-effect transistors bridging said central region and a respective one of said marginal regions while occupying respective quadrants of said rectangular area,
   each of said major doped portions being traversed by two substantially symmetrically disposed minor doped portions of the opposite conductivity type extending across one of said buses and defining channel sections lying between two outer terminal sections and an inner terminal section of the respective transistor pair, said outer terminal sections and said inner terminal section of each transistor pair constituting, respectively, either the source and drain areas or the drain and source areas of the transistors of that pair,
   the outer terminal sections of each transistor pair being each overlain by an external channel contact disposed in an accessible from the exterior of the respective marginal region,
   each transistor pair being further provided with a common internal channel contact overlying said inner terminal section of that transistor pair in said central region, and
   each transistor being additionally provided with an external gate contact disposed in and accessible from the exterior of the respective marginal region, the external gate contacts of two diagonally opposite complementary transistors of said pairs being interconnected by a strip of polycrystalline silicon overlying the associate channel sections and insulatedly intersecting both said buses.

2. A semiconductor chip as defined in claim 1 wherein each of the two remaining diagonally opposite complementary transistors is additionally provided with a respective internal gate contact disposed in said central region, each of said internal gate contacts being connected to the associated external gate contact of the same transistor by a respective further strip of polycrystalline silicon insulatedly intersecting a respective one of said buses.

3. A semiconductor chip as defined in claim 2 wherein the outer terminal sections of each transistor pair are additionally overlain by respectively further internal channel contacts disposed in said central region.

4. A semiconductor chip as defined in claim 3 wherein the external channel and gate contacts of each transistor pair are aligned in a formation adjacent the respective minor side of said rectangular area, and are separated from the proximal bus by a throughgoing transverse zone forming part of the respective marginal region.

5. A semiconductor chip as defined in claim 4 wherein said common internal channel contacts are closely spaced from said buses, respectively, and said further internal channel contacts and said internal gate contacts of both transistor pairs are concentrated in a midportion of said central region separated from said common internal channel contacts by other throughgoing transverse zones forming part of said central region.

6. A semiconductor chip as defined in claim 5 wherein said throughgoing transverse zones each have a width between one and two times the width of each of said buses.

7. A semiconductor chip as defined in claim 1 wherein said external gate contacts of each transistor pair lie outside the corresponding major doped portion.

8. A semiconductor chip as defined in claim 1 wherein each of said unit cells is provided with an additional polycrystalline silicon strip extending along one of the major edges of said rectangular area and bridging said marginal and central regions.

* * * * *